United States Patent [19]

Matthys

[11] Patent Number: 4,667,171
[45] Date of Patent: May 19, 1987

[54] VOLTAGE CONTROLLED OSCILLATOR WITH TEMPERATURE COMPENSATION

[75] Inventor: Robert J. Matthys, Minneapolis, Minn.

[73] Assignee: Honeywell Inc., Minneapolis, Minn.

[21] Appl. No.: 697,356

[22] Filed: Feb. 1, 1985

[51] Int. Cl.⁴ .................................................. H03L 1/02
[52] U.S. Cl. ...................................... 331/66; 331/111; 331/143; 331/176
[58] Field of Search ................... 331/66, 70, 111, 143, 331/176

[56] References Cited

U.S. PATENT DOCUMENTS

| | | | |
|---|---|---|---|
| 3,197,716 | 9/1962 | Wright et al. | 331/111 |
| 3,373,379 | 3/1968 | Black | 331/176 X |
| 3,742,379 | 6/1973 | McLean | 331/111 |
| 3,835,402 | 9/1974 | Kublick | 328/181 |
| 3,857,110 | 12/1974 | Grebene | 331/108 D |
| 3,902,139 | 8/1975 | Harrell | 331/108 D |
| 3,904,989 | 9/1975 | Cordell | 331/176 X |
| 3,906,391 | 9/1975 | Murdock | 331/166 |
| 3,916,342 | 10/1975 | Higuchi et al. | 331/111 |
| 3,996,531 | 12/1976 | Witlinger | 331/143 |
| 4,264,879 | 4/1981 | Duley | 331/111 |

Primary Examiner—Eugene R. LaRoche
Assistant Examiner—Robert J. Pascal
Attorney, Agent, or Firm—Charles J. Ungemach

[57] ABSTRACT

Changes in the output frequency of a voltage controlled oscillator circuit due to temperature changes are compensated for by shunting a resistor with two series diode resistor combinations. The variation in the diodes' voltage drip with temperature provides a resistance that varies with temperature, to correct for other resistance or capacitive changes with temperature in the circuit, thereby obtaining a more stable oscillator frequency in a varying temperature environment. Compensating for temperature effects by shunting a resistor with a means whose resistance decreases with temperature is a method applicable to circuits other that oscillators.

12 Claims, 8 Drawing Figures

VOLTAGE CONTROLLED OSCILLATOR WITH TEMPERATURE COMPENSATION

BACKGROUND OF THE INVENTION

1. Field of the Invention

This invention relates to methods and means for compensating electrical circuits for temperature effects by using electrical components whose resistance decreases with temperature.

2. Prior Art

U.S. Pat. No. 3,996,531 issued to Wittlinger discloses a voltage controlled circuit (described as an oscillator but more accurately it is a constant width pulse generator with a variable repetition rate) wherein the frequency is determined by the charging and discharging of a capacitor. The capacitor is alternately charged and discharged through separate resistor-diode paths. The rate of discharge of the capacitor is controlled by a control voltage. The control voltage can be increased or decreased by the application of a frequency control voltage to one terminal of an operational amplifier.

The frequency control voltage is increased or decreased to decrease or increase, respectively, the frequency of the output. The voltage drop across the diodes in the resistor-diode charge and discharge paths is a function of temperature. This in turn can effect the voltage applied to the capacitor. To compensate for this diode temperature dependence, two other diodes are employed.

Wittlinger does not compensate for frequency changes due to the temperature dependence of resistors or capacitors themselves. Further, Wittlinger's circuit is more of a variable pulse rate circuit rather than a traditional oscillator (i.e., a circuit wherein the on/off voltage ratio is approximately constant). Also, Wittlinger's frequency control voltage range is not centered about ground potential, a feature which is particularly advantageous in servo and feedback amplifier applications where systems are designed to operate about a null.

SUMMARY OF THE INVENTION

The present invention is a means and method for compensating an electrical circuit for the effects of temperature by using electrical components whose resistance decreases with temperature. The present invention is particularly suited for use with voltage controlled oscillators. In the preferred embodiment, first and second unidirectional current conducting means (preferably diodes) are connected in parallel at a node which is tied to a voltage control terminal in the circuit. The resistance of each unidirectional current conducting means decreases with temperature. On alternate half cycles of the circuit's operation, only one of the unidirectional current conducting means allows substantial current to pass.

DESCRIPTION OF THE PREFERRED EMBODIMENT

Figure 1:
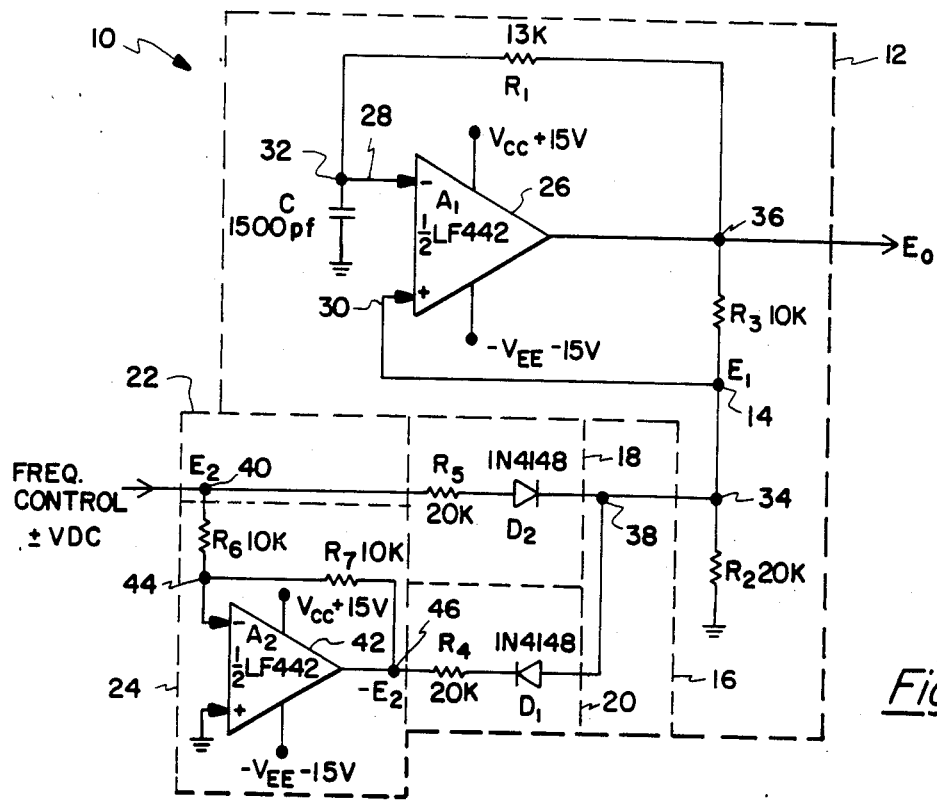
FIG. 1 is an electrical schematic of an oscillator employing the frequency control circuit.

Voltage controlled circuit 10 (see FIG. 1) includes a typical oscillator 12 (dashed line) controlled by a first voltage $E_1$ at node 14 and a means for varying $E_1$. The means for varying $E_1$ includes interface 16 (dashed line), first and second unidirectional current conducting means 18 and 20 (dashed line), respectively, means for applying 22 (dashed line) a first frequency control voltage ($E_2$) to unidirectional current conducting means 18 and means for applying 24 (dashed line) a second frequency control voltage ($-E_2$) of opposite polarity to unidirectional current conducting means 20.

Alternatively, the means for varying $E_1$ can be viewed as two elements. First, a means for varying $E_1$ by inputting a first frequency control $E_2$ voltage into circuit 10 when $E_1$ is of a first polarity (e.g., comprised of interface 16, unidirectional current conducting means 18 and voltage applying means 22). Second, a means for varying $E_1$ by inputting a second frequency control voltage $-E_2$ into circuit 10 when $E_1$ is the opposite polarity of the first polarity (e.g., comprised of interface 16, unidirectional current conducting means 20 and voltage applying means 24). Further, the magnitude of $E_2$ and $-E_2$ are substantially equal.

Oscillator 12 includes a first operational amplifier ($A_1$) 26 having inverting and noninverting inputs 28 and 30, respectively. A negative feedback loop includes resistor $R_1$ and capacitor C connected in series at node 32 with one plate of capacitor C grounded. A positive feedback loop includes resistors $R_2$ and $R_3$ connected in series at node 34. The output of oscillator 12 (i.e., $E_o$) is taken at node 36.

Interface 16 includes node 38. First and second unidirectional current conducting means 18 and 20 are preferably silicon diodes $D_2$ and $D_1$, respectively. Typically, unidirectional current conducting means 18 and 20 will also include resistors $R_5$ and $R_4$, respectively. Diodes $D_1$ and $D_2$ are connected in parallel at node 38 so that they will pass substantial current only in opposite directions between nodes 34 and 38. Diode $D_2$ has its p side connected (typically through $R_5$) to first frequency control voltage means 22. Diode $D_1$ has its n side connected (typically through $R_4$) to second frequency control voltage means 24.

First frequency control voltage means 22 includes node 40. The first frequency control voltage $E_2$ is applied directly to node 40 from an external $\pm$VDC source.

Second frequency control voltage means 24 includes a second operational amplifier ($A_2$) 42. Amplifier $A_2$ has a gain of $-1$. Negative feedback is provided to amplifier $A_2$ through resistor $R_7$ connected between nodes 44 and 46. The noninverting input to amplifier $A_2$ is grounded. Resistor $R_6$ is connected between nodes 40 and 44.

In operation, oscillator 12 oscillates in typical fashion. Capacitor C charges up to voltage $\pm E_1$ whereupon output voltage $E_o$ switches polarity. Amplifier $A_1$ is operating in the saturated region therefore the magnitude of voltage $E_o$ is constant. When voltage $E_o$ switches polarity so does voltage $E_1$. Capacitor C now charges down to voltage $-E_1$ whereupon $E_o$ reverses polarity again.

Figure 2:
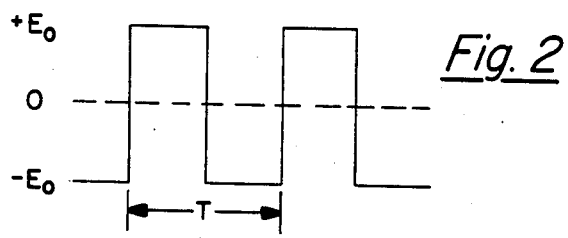
FIG. 2 is an output waveform of the circuit of FIG. 1.
Figure 3:
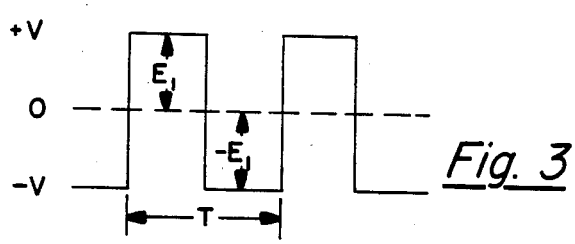
FIG. 3 is a waveform of the positive feedback voltage $E_1$ for the oscillator included in the circuit of FIG. 1 with the frequency control voltage $E_2$ equal to zero.

The output of oscillator 12 is a square wave as shown in FIG. 2. The frequency of oscillation is determined by the time constant of the negative feedback loop (i.e., $R_1C$) and the resistance ratio of $R_2$ to the parallel combination of $R_3$ with $R_4$ or $R_5$ which defines voltage $E_1$. Resistor $R_2$ and resistor $R_3$ in parallel with $R_4$ or $R_5$ serve as a voltage divider for voltage $E_o$. The period of oscillation of oscillator 12 is shown as T in FIG. 2.

Circuit 10 varies voltage $E_1$ by alternately inputting first and second frequency control voltages (i.e. $\pm E_2$) into the means for varying $E_1$. This in turn varies the frequency of the output of oscillator 12. Frequency control voltages $E_2$ and $-E_2$ are preferably equal in magnitude but of opposite polarity.

Voltage $E_2$ (a DC voltage which is either positive or negative) is applied to node 40 of first frequency control voltage means 22. Second frequency control voltage means 24 inverts $E_2$ and applies $-E_2$ to node 46. Circuit 10 employs operational amplifier $A_2$ in a negative feedback configuration to invert voltage $E_2$. Other inversion means could be employed instead of amplifier $A_2$. Further, the second frequency control voltage $-E_2$ could be applied directly to second frequency control voltage means 24 by, for example, applying a voltage $-E_2$ directly to node 46 and excising amplifier $A_2$ and resistors $R_6$ and $R_7$. Preferably amplifier $A_2$ has a gain of $-1$ and $R_6$ equals $R_7$.

Figure 4:
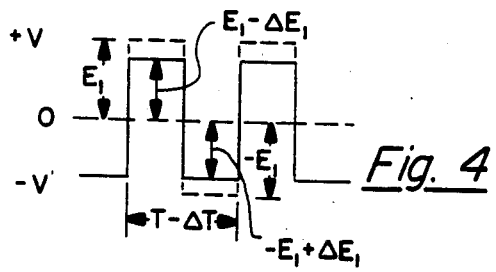
FIG. 4 shows the effect on the waveform of FIG. 3 of inputting a positive frequency control voltage $E_2$.

When $E_1$ and $E_2$ are positive, diode $D_1$ conducts and diode $D_2$ is off. Thus the negative voltage $-E_2$ at node 46 reduces $E_1$ by $\Delta E_1$ (see FIG. 4), thereby shortening the time for capacitor C to charge to the $A_1$'s switching point.

If $E_2$ is positive but $E_1$ is negative, diode $D_2$ conducts and diode $D_1$ is off. The positive $+E_2$ voltage at node 40 decreases $-E_1$ by $\Delta E_1$ and again shortens the time for capacitor C to charge to $A_1$'s switching point. The net result of inputting a positive frequency control voltage into circuit 10 is to shorten both the positive and negative halves of period T (i.e., reduced by $\Delta T$) and this raises the frequency of $E_o$.

Figure 5:
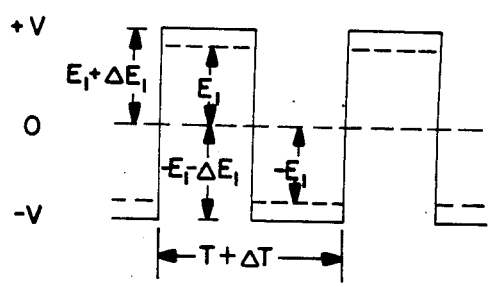
FIG. 5 shows the effect on the waveform of FIG. 3 of inputting a negative frequency control voltage $E_2$.

If $E_2$ is negative, the reverse effect occurs (see FIG. 5) with T increasing (i.e., increased by $\Delta T$) and the frequency of $E_o$ decreasing. Note, however, that in all cases the on/off ratio of the oscillator output $E_o$ remains constant as the frequency changes. Further, the on/off ratio is substantially independent of the magnitude or polarity of $E_2$.

The magnitude of $\Delta E_1$ will depend on the particular components in circuit 10 and especially on the value of resistors $R_2$, $R_3$, $R_4$ and $R_5$. The magnitude of $E_2$ will be larger and generally some multiple of the magnitude of $\Delta E_1$. Further the $\pm \Delta E_1$ changes in $E_1$ can be considered the first and second frequency control voltages from an operational viewpoint.

Approximately linear frequency changes with $E_2$ will be achieved over a range of $\pm \Delta E_1 \leq 0.25\ E_1$. This is because circuit 10 charges and discharges an RC network, and the exponential shape of the charging/discharging curve is appropriately linear over the above range.

Figure 6:
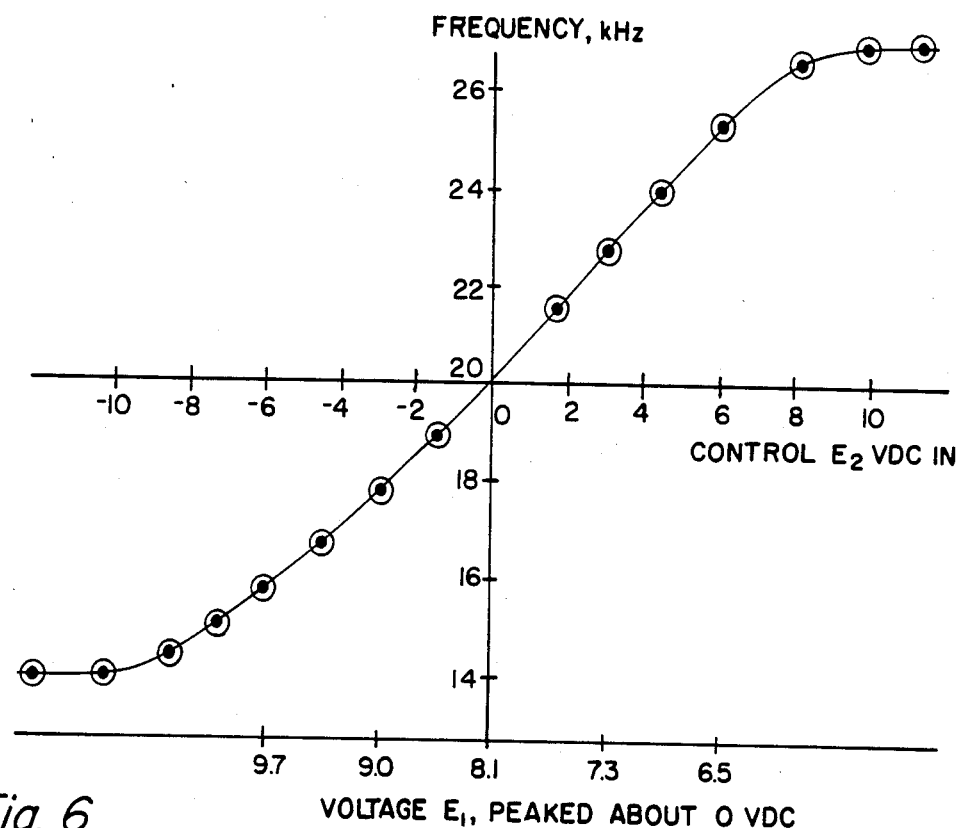
FIG. 6 is a graph of data showing the frequency change of FIG. 1 as a function of the oscillator feedback voltage $E_1$ and the frequency control voltage $E_2$.

FIG. 6 displays the change in frequency with control voltage over the range described above. The circuit of FIG. 6 was used with the component values shown in FIG. 1. These component values were selected to provide a large frequency control range. Common industry code numbers are given for the diodes and amplifiers.

Because the frequency control voltage $\pm E_2$ is centered about ground potential, circuit 10 is particularly advantageous for many servo mechanism circuits and feedback amplifier applications that drive toward a null.

The ability of circuit 10 to increase or decrease frequency solely as a function of the polarity of the frequency control voltage is another attractive circuit feature. By reversing the polarity of the unidirectional means $D_1$ and $D_2$ in FIG. 1 the polarity of the control function can be reversed. A $(+)$ frequency control voltage at 40 would then decrease the oscillator frequency rather than increase it and a $(-)$ frequency control voltage at 40 would increase the frequency.

In addition to easy and versatile frequency control, circuit 10 compensates oscillator 12 for frequency changes due to the effects of temperature on the oscillator frequency controlling resistors and capacitors in the negative feedback loop (i.e., resistor $R_1$ and capacitor C).

Resistor $R_1$ and capacitor C usually have positive temperature coefficients and thus the time constant for oscillator 12 will increase with temperature. To compensate, the voltage at node 34 (i.e., $E_1$) has to decrease with temperature.

Circuit 10 compensates for this temperature dependence by using unidirectional current conducting means 18 and 20 whose resistances decrease with an increase in temperature. Such components are conveniently provided by a silicon diode in series with a resistor. The voltage drop across a silicon diode decreases with temperature at approximately 0.002 volts/° C.

Figure 7:
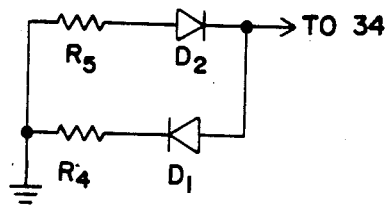
FIG. 7 is an electrical schematic of a temperature compensation circuit without frequency control which can be used with part of the circuit of FIG. 1.

The variation in voltage drop of silicon diodes with temperature is an inherent characteristic of a silicon pn junction, so that generally any ordinary silicon diode can be used. The temperature compensation scheme can be employed independent of the frequency control function described above. Therefore, as shown in FIG. 7, temperature compensation without the frequency control function could be provided for oscillator 12 by grounding the left ends of resistors $R_4$ and $R_5$ and excising 22 and 24. The temperature compensation scheme can be employed with any circuit where the frequency of operation is controlled by the charging of an R-C branch.

Figure 8:
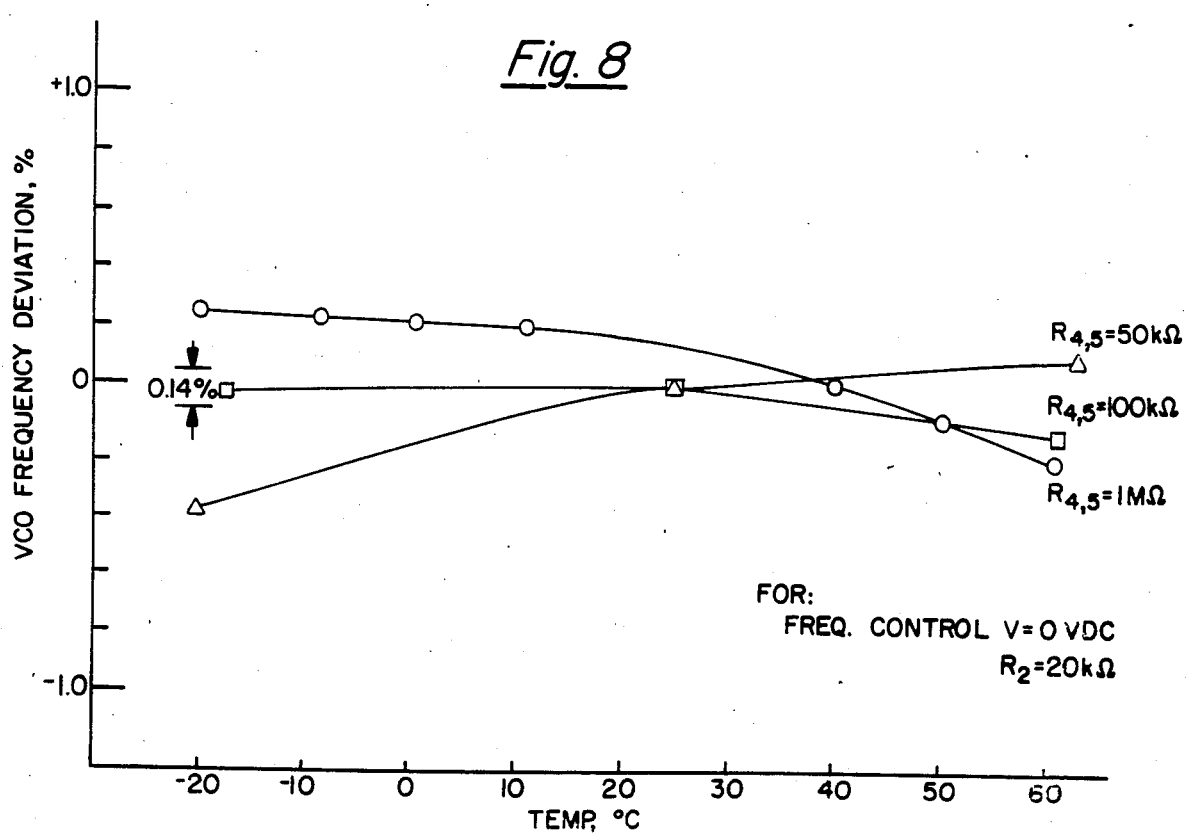
FIG. 8 is a graph of data showing the frequency stability of the circuit of FIG. 1 as a function of temperature.

The actual temperature correction obtained depends on the ratios $R_4/R_2$ and $R_5/R_2$. FIG. 8 shows over, under and correct temperature compensation data obtained on a test oscillator using stable 1% metal film resistors and a stable NPO capacitor for C. It shows that the $R_4/R_2$ (and $R_5/R_2$) ratio is not critical for correct temperature compensation. The correct temperature compensation curve in FIG. 8 shows a maximum frequency change of 0.14% over a $-20°$ C. to $+60°$ C. temperature range. This gives an overall frequency-temperature coefficient of 17 parts per million/° C.

The temperature compensation circuit herein disclosed provides a 3 to 6 times reduction in oscillator frequency change with temperature relative to an uncompensated oscillator circuit using stable 1% metal film resistors and a stable NPO capacitor. The exact improvement ratio depends on the actual temperature coefficients of the components used for $R_1$ and C.

Some typical values for frequency temperature compensation for the resistors in FIG. 1 are shown in FIG. 8 and it is convenient to set $R_2=R_3$, $R_4=R_5$ and $R_6=R_7$. These values were selected for optimum temperature control with a smaller frequency control range.

The temperature compensation method described herein is particularly useful for oscillators, but it is also useful for other applications where the correction of a resistance change with temperature is desired, such as filters, gain control networks and phase control and correction networks.

In general, temperature compensation is achieved by shunting a resistance means with a means whose resistance decreases with temperature. Compensation can occur not only for the shunted resistance means but also for resistances elsewhere in the circuit.

What is claimed is:

1. A temperature compensated electrical circuit, comprising:
    a first portion of said circuit having a frequency of operation determined by the charging to a control voltage of a capacitor connected in series with a resistor, wherein said control voltage is established at a node;
    temperature compensating means, including:
    first and second unidirectional current conducting means connected in parallel at said node and adapted to pass substantial current only in different directions through said node, and wherein the resistance of each of said first and second unidirectional current conducting means decreases as temperature increases.

2. The circuit of claim 1 wherein said first and second unidirectional current conducting means are silicon diodes.

3. The circuit of claim 1 further including first, second and third resistor means, wherein said first resistor means is electrically connected to and between said first unidirectional current conducting means and a voltage reference point, said second resistor means is electrically connected to and between said second unidirectional current conducting means and said voltage reference point and said third resistor means is electrically connected to and between said node and said voltage reference point.

4. The circuit of claim 1 wherein said first portion is an oscillator.

5. A method of compensating an electrical circuit for temperature effects wherein said circuit has a frequency of operation determined by the charging to a control voltage of a capacitor connected in series with a resistor and wherein said control voltage is established at a node, comprising:
    passing current through a first unidirectional current conducting means when the output of said circuit is a first polarity, wherein the resistance of said first unidirectional current conducting means decreases with temperature; and
    passing current through a second unidirectional current conducting means when said output is a second polarity, wherein the resistance of said second unidirectional current conducting means decreases with temperature and said first and second unidirectional current conducting means are connected in parallel at said node.

6. The method of claim 5 wherein said electrical circuit is an oscillator.

7. A circuit means for compensating an electrical circuit for temperature effects wherein said electrical circuit includes a control node having a voltage with respect to a voltage reference point, a first resistance means wherein the resistance of said first resistance means increases with increasing temperature and an increase in the resistance of said first resistance means affects said voltage, a first electrical path, said first electrical path being between said control node and said voltage reference point and wherein said temperature effects due to increasing temperature can be compensated for by lowering the voltage at said control node, said circuit means comprising:
    a second electrical path, said second electrical path being between said control node and said voltage reference point; and
    a second resistance means wherein the resistance of said second resistance means decreases with increasing temperature, said second resistance means being part of said second electrical path.

8. The circuit of claim 7 wherein said second resistance means includes a silicon diode.

9. The circuit means of claim 7 further including a third electrical path between said control node and said voltage reference point, and a third resistance means wherein the resistance of said third resistance means decreases with increasing temperature, said third resistance means being part of said third electrical path.

10. A circuit means for compensating an electrical circuit for temperature effects wherein said electrical circuit includes a first node, a voltage reference point, a control node, first and second resistance means wherein the resistance of each of said first and second resistance means increases with increasing temperature, first and second electrical paths wherein said first electrical path is between said first node and said control node and includes said first resistance means, and said second electrical path is between said control node and said voltage reference point and includes said second resistance means, wherein an increase in the resistance of either said first or second resistance means affects the voltage at said control node, and said temperature effects due to increasing temperature can be compensated for by lowering the voltage at said control node, said circuit means including:
    a third electrical path, said third electrical path being between said control node and said voltage reference point; and
    a third resistance means wherein the resistance of said third resistance means decreases with increasing temperture, said third resistance means being part of said third electrical path.

11. The circuit means of claim 10 wherein said third resistance means includes a silicon diode.

12. The circuit means of claim 10 further including a fourth electrical path between said control node and said voltage reference point, and a fourth resistance means wherein the resistance of said fourth resistance means decreases with increasing temperature, said fourth resistance means being part of said fourth electrical path.

* * * * *